(12) United States Patent
Chia

(10) Patent No.: US 8,058,723 B2
(45) Date of Patent: Nov. 15, 2011

(54) PACKAGE STRUCTURE IN WHICH CORELESS SUBSTRATE HAS DIRECT ELECTRICAL CONNECTIONS TO SEMICONDUCTOR CHIP AND MANUFACTURING METHOD THEREOF

(75) Inventor: Kan-Jung Chia, Hsinchu (TW)

(73) Assignee: Phoenix Precision Technology Corporation, Hsinchu (TW)

( * ) Notice: Subject to any disclaimer, the term of this patent is extended or adjusted under 35 U.S.C. 154(b) by 503 days.

(21) Appl. No.: 12/076,470

(22) Filed: Mar. 19, 2008

(65) Prior Publication Data

US 2009/0236750 A1 Sep. 24, 2009

(51) Int. Cl.
*H01L 23/52* (2006.01)

(52) U.S. Cl. .................. 257/700; 257/758; 257/E23.02; 257/E23.023

(58) Field of Classification Search .................. 257/686, 257/689, 700, 787, E23.063
See application file for complete search history.

(56) References Cited

U.S. PATENT DOCUMENTS

| | | | | |
|---|---|---|---|---|
| 5,758,413 A * | 6/1998 | Chong et al. | | 29/852 |
| 2002/0145197 A1 * | 10/2002 | Ohta et al. | | 257/734 |
| 2005/0284655 A1 * | 12/2005 | Hsu et al. | | 174/255 |
| 2007/0132072 A1 * | 6/2007 | Chang | | 257/666 |
| 2007/0281464 A1 * | 12/2007 | Hsu | | 438/624 |
| 2008/0006936 A1 * | 1/2008 | Hsu | | 257/731 |
| 2008/0165515 A1 * | 7/2008 | Hsu et al. | | 361/783 |
| 2008/0191326 A1 * | 8/2008 | Lin et al. | | 257/666 |
| 2008/0210460 A1 * | 9/2008 | Lien et al. | | 174/260 |
| 2008/0230886 A1 * | 9/2008 | Wong et al. | | 257/686 |
| 2008/0246135 A1 * | 10/2008 | Wong et al. | | 257/686 |
| 2009/0046432 A1 * | 2/2009 | Hsu | | 361/717 |
| 2009/0065245 A1 * | 3/2009 | Hsu | | 174/260 |
| 2009/0065246 A1 * | 3/2009 | Shih | | 174/264 |
| 2010/0032827 A1 * | 2/2010 | Hsu | | 257/692 |

* cited by examiner

*Primary Examiner* — May Wilczewski
*Assistant Examiner* — Toniae Thomas
(74) *Attorney, Agent, or Firm* — Bacon & Thomas, PLLC

(57) ABSTRACT

A package structure in which a coreless substrate has direct electrical connections to a semiconductor chip and a manufacturing method thereof are disclosed. The method includes the following steps: providing a metal carrier board having a cavity; placing a chip having a plurality of electrode pads on an active surface in the cavity of a board; filling the cavity with an adhesive for fixing the chip; forming a solder mask on the active surface of the chip and the surface of the metal carrier board at the same side, wherein the solder mask has a plurality of openings to expose the electrode pads of the chip; forming a built-up structure on the solder mask and the exposed active surface of the chip in the openings; and removing the metal carrier board. In this method the metal carrier board can support the built-up structure to thereby avoid warpage.

4 Claims, 6 Drawing Sheets

PACKAGE STRUCTURE IN WHICH CORELESS SUBSTRATE HAS DIRECT ELECTRICAL CONNECTIONS TO SEMICONDUCTOR CHIP AND MANUFACTURING METHOD THEREOF

BACKGROUND OF THE INVENTION

1. Field of the Invention

The present invention relates to a package structure and a manufacturing method thereof. In more detail, the present invention relates to a package structure and a manufacturing method thereof in which a coreless substrate with circuits has direct electrical connections to a semiconductor chip.

2. Description of Related Art

As the electronics industry develops rapidly, research moves towards electronic devices with multiple functions and high performance. Hence, circuit boards with many active and passive components and circuit connections integrated therein have advanced from being single-layered boards to multi-layered boards by an interlayer connection technique, so as to expand circuit layout space in a limited circuit board to thereby meet the demand of the application of high-density integrated circuits.

With regard to conventional semiconductor package structures, a chip is mounted on the top surface of a packaging substrate, and then electrically connected thereto by wire bonding. Alternatively, the chip is electrically connected with the top surface of the substrate by the flip chip technique. Then, electrical connections to a printed circuit board can be achieved by disposing solder balls on the back surface of the substrate. However, even though the purpose of high quantity pin counts can be achieved through the method illustrated above, the electrical performance of a device operated in higher frequency or at higher speed can be unavailable or limited due to the long paths of conductive circuits.

An advanced structure of a flip chip ball grid array (FCBGA) packaging substrate is shown in FIG. 1. In the manufacturing of the FCBGA package structure, a semiconductor chip 10, which has electrode pads 101 on an active surface used for signal input and output, is first provided. Solder bumps 11 are formed on the electrode pads 101 and electrically connect to the bump pads 121a disposed on a substrate 12 having a core layer 120. The substrate 12 here has a plurality of wiring layers 122 and insulation layers 123. In addition, two of wiring layers 122 are electrically connected to each other by conductive vias 125. Moreover, a solder mask 13a is formed on a top wiring layer 122a of the substrate 12 to protect the top wiring layer 122a and to expose the bump pads 121a. Furthermore, the core layer 120 has a plurality of plated through holes 124 conducting the wiring layers 122 on both the surfaces thereof. A bottom wiring layer 122b of the substrate 12 has a plurality of ball pads 121b. Besides, a solder mask 13b is formed on the bottom wiring layer 122b so as to protect the bottom wiring layer 122b and to expose the ball pads 121b. Solder balls 14 are formed on the ball pads 121b to offer electrical connections for a printed circuit board (not shown). Finally, a flip chip ball grid array packaging substrate is obtained.

Even though a flip chip ball grid array packaging substrate could meet the requirement of high quantity pin counts and be used in a device operated in high frequency, there are many limitations in this technique, especially regarding electrical connections. That is, the material used in electrical connections (e.g. solder materials containing Pb) may be prohibited for application due to environmental protection. Furthermore, other alternative materials still have electrical and mechanical problems, such as unstable quality of connections, and those problems are still awaiting solutions. Besides, a conventional flip-chip package structure is electrically connected to a semiconductor chip by solder bumps. During the process of manufacturing fine circuits, filling of a gap between the semiconductor chip and the packaging substrate with resin is required. However, resin is viscous and does not easily flow into the gap, thus the finer the circuits of a packaging substrate, the longer the time needed for filling with the resin. Additionally, there are many unfilled voids in the resin filled region, resulting in increased risk of bust-up of the package structure.

Otherwise, the aforementioned substrate 12 having the core layer 120 is formed by way of the following steps. First, circuit formation is performed on a dielectric layer, and then the core layer 120 is obtained. Manufacturing of a built-up structure is subsequently performed on the core layer 120 so that the substrate 12 has a plurality of circuit layers. Additionally, the core layer 120 has a plurality of plated through holes 124 (PTHs) formed therein. In general, the diameter of the plated through holes 124 is about 100 μm or more. The diameter of the conductive vias is about 50 μm. However, the formed plated through holes 124 compromise the flexibility of the fine circuit layout. Hence, reduction of conductive paths in the substrate 12 is limited, and the electrical characteristics could not be well improved. Furthermore, the thickness of the substrate 12 could not be decreased efficiently because of the existence of the core layer 120. On the other hand, if the core layer 120 is thinned to 60 μm or less, it is difficult to produce the substrate 12, and further results in great reduction in the yield of the substrate 12. Therefore, the core layer 120 does not favor reduction of the whole thickness of the package structure, thus the demands of compact and lightweight electronic devices have not been met.

In the manufacturing of the foregoing substrate with multiple circuit layers, the core layer needs to be prepared first. Subsequently, the dielectric layers and circuit layers stacked on the core layer are formed to obtain a multilayered substrate. These steps of the manufacturing are complex and not easily simplified.

Therefore, the issue of how to provide a circuit board structure, or a method for manufacturing the same to avoid limitations as the mentioned above, e.g. reduction of the substrate thickness, an increase of circuit layer density, good yield of products, and simplification of the manufacturing, is important in this field.

SUMMARY OF THE INVENTION

The object of the present invention is to provide a package structure in which a coreless substrate has direct electrical connections to a semiconductor chip and a method for manufacturing the same, so that connection between the semiconductor chip and the coreless substrate, and formation of the conductive structures thereof can be integrated together. Hence, simplification of the manufacturing can be achieved.

Another object of the present invention is to provide a package structure in which a coreless substrate has direct electrical connections to a semiconductor chip and a method for manufacturing the same so that the flexibility of fine circuit layouts can be promoted, and the reduction of conductive paths can be achieved. Consequently, the electrical properties of semiconductor devices can be promoted.

Furthermore, another object of the present invention is to provide a package structure in which a coreless substrate has direct electrical connections to a semiconductor chip and a method for manufacturing the same so that the thinned packaging substrate can be effective in decreasing the whole thickness of the semiconductor package structure. Therefore, the desired compact and lightweight electronic products can be made.

To achieve the foregoing and other objects, the present invention provides a method for manufacturing a package structure in which a coreless substrate has direct electrical connections to a semiconductor chip, comprising the following steps:

providing a metal carrier board having at least one cavity; placing a semiconductor chip in the cavity of the metal carrier board, wherein the semiconductor chip has an active surface and an opposite inactive surface, the inactive surface of the semiconductor chip faces the cavity of the metal carrier board so that the semiconductor chip is placed therein, and the active surface has a plurality of electrode pads thereon; filling the cavity with an adhesive material for fixing the semiconductor chip; forming a first solder mask on the active surface of the semiconductor chip and on the surface of the metal carrier board at the same side with the active surface, and forming a plurality of first openings in the first solder mask to expose the electrode pads of the semiconductor chip; forming a built-up structure on the surface of the first solder mask and on the active surface of the semiconductor chip exposed by the first openings, wherein the built-up structure has a circuit layer electrically connected to the electrode pads of the semiconductor chip; and removing the metal carrier board to thereby expose the semiconductor chip, the adhesive material wrapping the semiconductor chip, and a partial surface of the first solder mask.

In the aforementioned method, the metal carrier board can be totally removed in the step of removing the metal carrier board. Alternatively, a part of the metal carrier board is not removed and serves as a metal supporting frame to enhance the rigidity of the built-up structure.

In the foregoing method, the built-up structure comprises at least one dielectric layer, at least one circuit layer stacked on the dielectric layer, and a plurality of conductive vias; the outermost circuit layer from the semiconductor chip has a plurality of conductive pads. Parts of the conductive vias each respectively penetrates the first openings of the first solder mask to electrically connect to the electrode pads of the semiconductor chip.

The aforesaid method can further comprise a step of forming a second solder mask on the other surface of the built-up structure, and forming a plurality of second openings in the second solder mask, to thereby expose the conductive pads of the built-up structure.

The present invention further provides another method for manufacturing a coreless substrate with direct electrical connections to a semiconductor chip, which comprises the following steps: providing a metal carrier board having at least one cavity; placing a semiconductor chip in the cavity of the metal carrier board, wherein the semiconductor chip has an active surface and an opposite inactive surface, the inactive surface of the semiconductor chip faces the cavity of the metal carrier board so that the semiconductor chip is placed therein, and the active surface has a plurality of electrode pads thereon; filling the cavity with an adhesive material for fixing the semiconductor chip; forming a built-up structure on the active surface of the semiconductor chip and on the surface of the metal carrier board at the same side with the active surface, wherein the built-up structure has a circuit layer electrically connected to the electrode pads of the semiconductor chip; removing the metal carrier board to thereby expose the semiconductor chip, the adhesive material wrapping the semiconductor chip, and a partial surface of the built-up structure at the same side with the semiconductor chip; and forming a first solder mask on the uncovered region of the surface with the semiconductor chip disposed thereon of the built-up structure.

In the aforementioned method, the built-up structure comprises at least one dielectric layer, at least one circuit layer stacked on the dielectric layer, and a plurality of conductive vias; the outermost circuit layer from the semiconductor chip has a plurality of conductive pads. Parts of the conductive vias electrically connect to the electrode pads of the semiconductor chip.

The foregoing method further comprises a step of forming a second solder mask on the other surface of the built-up structure not at the same side with the semiconductor chip, and forming a plurality of second openings in the second solder mask, to thereby expose the conductive pads of the built-up structure.

The present invention further provides a package structure in which a coreless substrate has direct electrical connections to a semiconductor chip, comprising: a semiconductor chip having an active surface and an opposite inactive surface, wherein the active surface has a plurality of electrode pads thereon; a built-up structure having a first surface and an opposite second surface, wherein the built-up structure comprises at least one dielectric layer, at least one circuit layer stacked on the dielectric layer, and a plurality of conductive vias; the outermost circuit layer of the second surface of the built-up structure has a plurality of conductive pads; and a first solder mask, which has a plurality of openings corresponding to the electrode pads of the semiconductor chip, disposed on the first surface of the built-up structure, wherein parts of the conductive vias in the built-up structure each respectively penetrate the first openings of the first solder mask, electrically connecting to the electrode pads of the semiconductor chip.

The aforesaid structure can further comprise a second solder mask disposed on the second surface of the built-up structure. The second solder mask has a plurality of second openings exposing the conductive pads of the built-up structure.

The foregoing structure can further comprise a metal supporting frame disposed on the first solder mask to thereby enhance the rigidity of the built-up structure.

The aforementioned structure can further comprise an adhesive material wrapping and protecting the semiconductor chip, also enhancing the adhesion between the semiconductor chip and the built-up structure. In addition, the inactive surface of the semiconductor chip is exposed to dissipate heat generated by the semiconductor chip during operation.

Consequently, the present invention integrates the semiconductor chip with the built-up structure. That is, the semiconductor chip is directly connected to the substrate instead of solder bumps. Hence, connection between the semiconductor chip and the coreless substrate, and formation of the conductive structures are integrated with each other at the same time so as to simplify the manufacturing. Meanwhile, flexibility of fine circuit layout can be advanced, and reduction of conductive paths can be achieved, resulting in a promotion in electrical performance of the semiconductor devices. Furthermore, the packaging substrate can be thinned to beneficially decrease the whole thickness of the semiconductor package structure. Therefore, the demands of compact and lightweight electronic products can be met.

Other objects, advantages, and novel features of the invention will become more apparent from the following detailed description when taken in conjunction with the accompanying drawings.

BRIEF DESCRIPTION OF THE DRAWINGS

FIGS. 2A to 2E-1 show a cross-section flowchart of the manufacturing in Embodiment 1 of the present invention;

FIGS. 3 and 3-1 show cross-sections of the structures in Embodiment 2 of the present invention.

DETAILED DESCRIPTION OF THE PREFERRED EMBODIMENT

Figure 1:
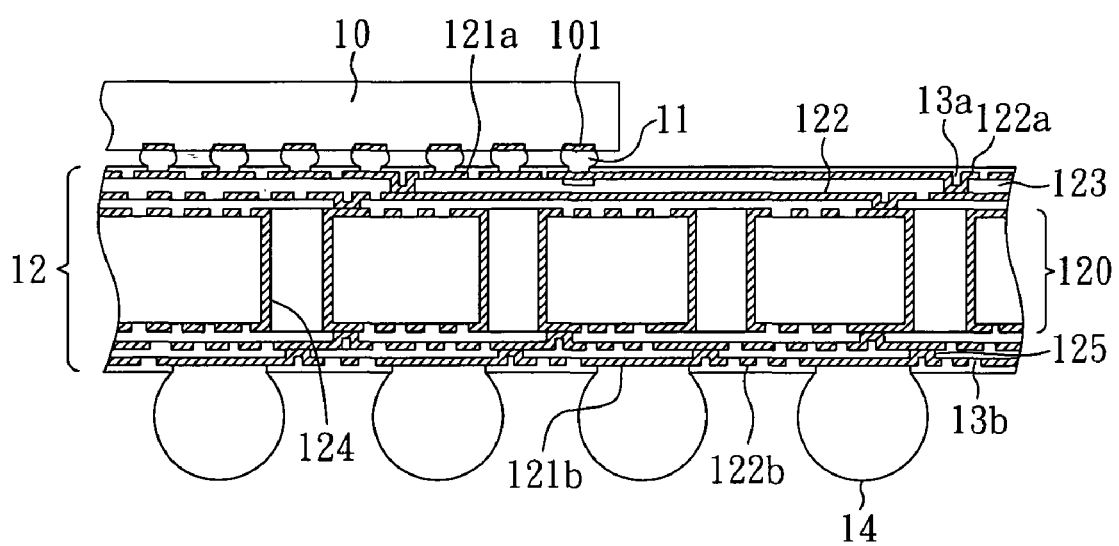
FIG. 1 shows a cross-section of a conventional FCBGA package structure.

Because the specific embodiments illustrate the practice of the present invention, a person having ordinary skill in the art can easily understand other advantages and efficiency of the present invention through the content disclosed therein. The present invention can also be practiced or applied by other variant embodiments. Many other possible modifications and variations of any detail in the present specification based on different outlooks and applications can be made without departing from the spirit of the invention.

With reference to FIGS. 2A to 2E, there is shown a cross-section flowchart of a method for manufacturing a coreless substrate with direct electronic connections to a semiconductor chip in a preferred Embodiment of the present invention. It is to be noted that the drawings of the Embodiments in the present invention are all simplified charts or views, and only reveal elements relative to the present invention. The elements exposed in the drawings are not necessarily aspects of the practice, and quantity and shape thereof are optionally designed. Further, the design aspect of the elements can be more complex.

Embodiment 1

Figure 2A:
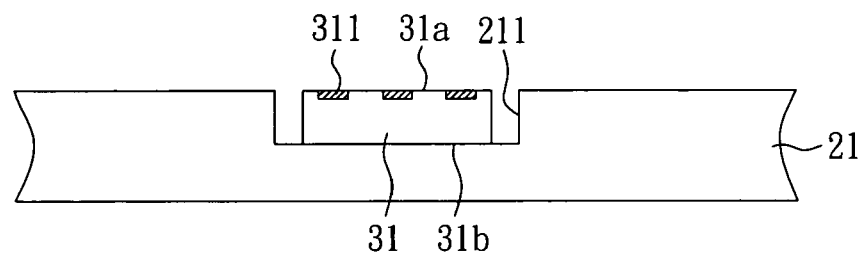

First, as shown in FIG. 2A, a metal carrier board 21 having at least one cavity 211 is provided. The metal carrier board 21 can be made of Al, Cu, Fe, or an alloy thereof. In detail, the cavity 211 is formed through etching. Then, a semiconductor chip 31 is disposed in the cavity 211 of the metal carrier board 21. The semiconductor chip 31 has an active surface 31a and an opposite inactive surface 31b. The active surface 31a of the semiconductor chip 31 has a plurality of electrode pads 311 thereon. In addition, the inactive surface 31b of the semiconductor chip 31 faces the cavity 211 of the metal carrier board 21 so that the semiconductor chip 31 is placed therein. In particular, the inactive surface 31b of the semiconductor chip 31 is temporarily fixed on the bottom of the cavity 211 by an adhesive material (not shown). The semiconductor chip 31 can be an active component or a passive component. The passive component can be a resistor, a capacitor, or an inductance.

Figure 2B:
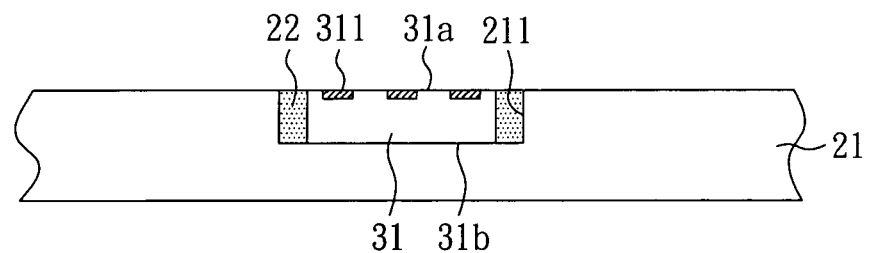

Subsequently, as shown in FIG. 2B, the cavity 211 with the semiconductor chip 31 placed therein is filled with an adhesive material 22 by stencil printing or dispensing for fixing the semiconductor chip 31. The adhesive material can be, e.g. organic dielectric material, liquid organic resin material, or prepreg.

Figure 2C:
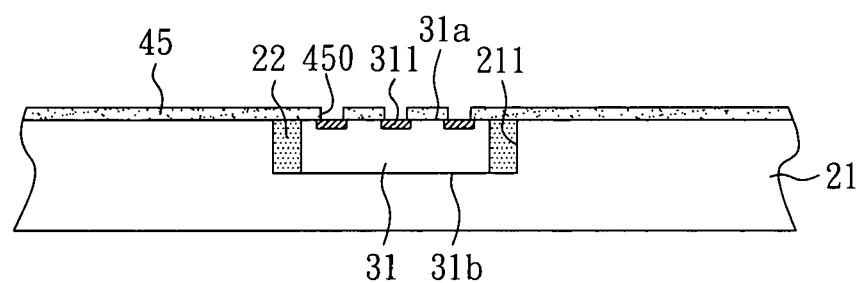

Then, as shown in FIG. 2C, a first solder mask 45 is formed on the active surface 31a of the semiconductor chip 31 and on a surface of the metal carrier board 21 at the same side with the active surface 31a. The first solder mask 45 has a plurality of first openings 450 exposing the electrode pads 311 of the semiconductor chip 31.

Figure 2D:
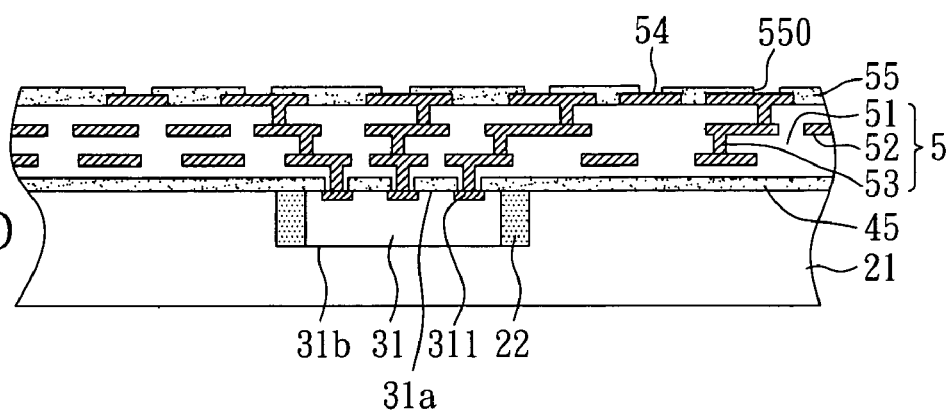
Figures 1, 2D:
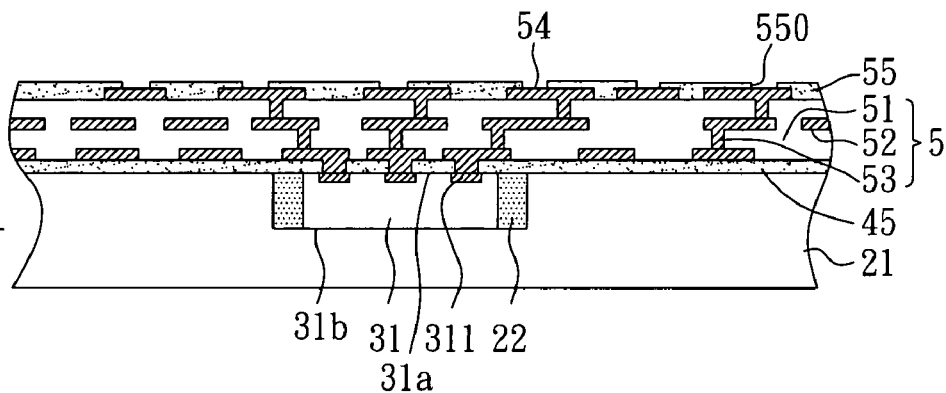

Furthermore, as shown in FIGS. 2D and 2D-1, a built-up structure 5 is formed on the surface of the first solder mask 45 and on the active surface 31a of the semiconductor chip 31 exposed by the first openings 450. The built-up structure 5 includes at least one dielectric layer 51, at least one circuit layer 52 stacked on the dielectric layer 51, and a plurality of conductive vias 53; the outermost circuit layer 52 from the semiconductor chip 31 has a plurality of conductive pads 54. In addition, some of the conductive vias 53 each respectively penetrate the first openings 450 of the first solder mask 45, electrically connecting to the electrode pads 311 of the semiconductor chip 31. Furthermore, a second solder mask 55 is formed on the surface of the built-up structure 5, and has a plurality of second openings 550 formed therein, to thereby expose the conductive pads 54 of the built-up structure 5, The built-up technique of the built-up structure 5 is not illustrated herein because that is well known in the art. With reference to FIG. 2D-1, there is shown another aspect of the present Embodiment. In FIG. 2D-1, the circuit layer 52 is first formed on the surface of the first solder mask 45 during manufacturing the built-up structure 5. However, in FIG. 2D, the dielectric layer 51 is first formed on the first solder mask 45 during manufacturing the built-up structure 5.

In the method of the present invention, the metal carrier board 21 is used for a support of the built-up structure 5 in order to avoid warpage.

Figure 2E:
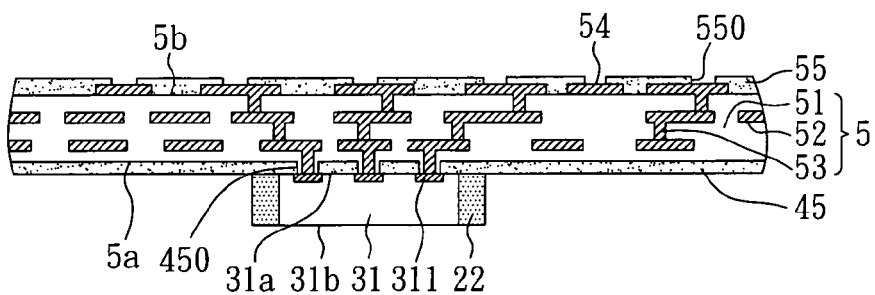
Figures 1, 2E:
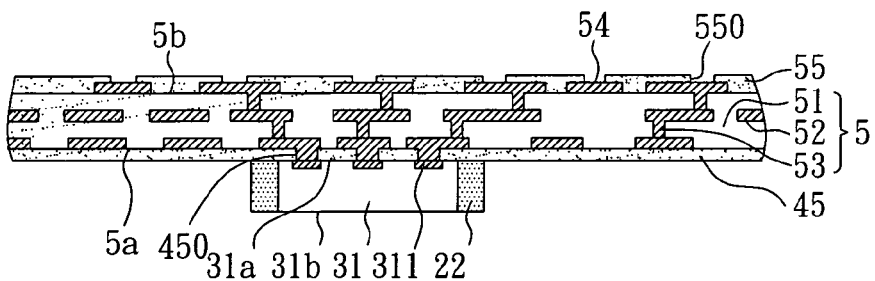

Finally, as shown in FIGS. 2E and 2E-1, the metal carrier board 21 is totally removed by etching, whereby the manufacturing of the present invention is completed. The differences between FIGS. 2E and 2E-1 can be known with reference to the illustration of FIGS. 2D and 2D-1.

Embodiment 2

Figure 3:
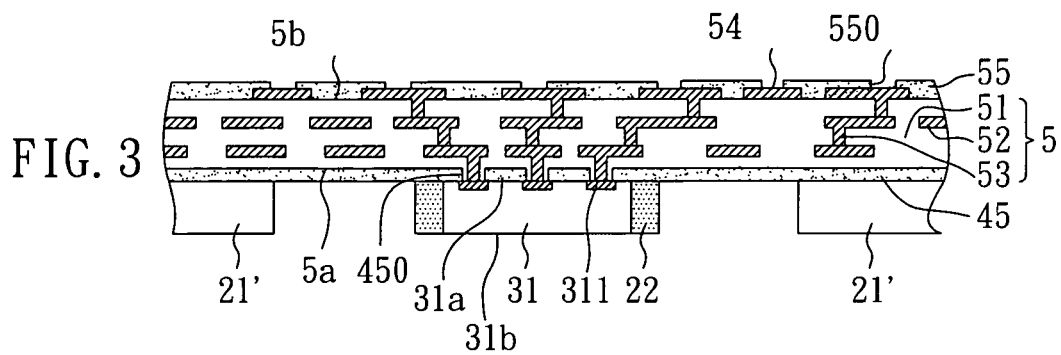
Figures 1, 3:
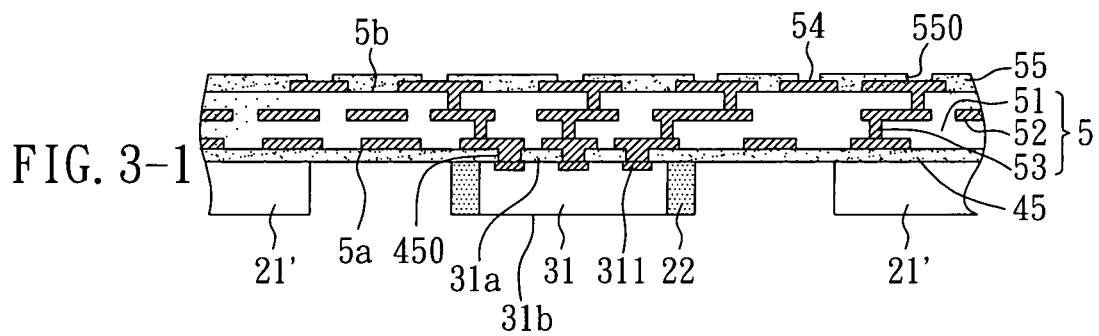

With reference to FIGS. 3 and 3-1, the present Embodiment has some differences as compared to Embodiment 1, listed as follows. While removing the metal carrier board 21, a part of the metal carrier board 21 is not removed so that a part of the first solder mask 45 is exposed. The remaining part of the metal carrier board 21 serves as a metal supporting frame 21'. Hence, the rigidity of the built-up structure 5 can be enhanced. Other steps are the same as those of Embodiment 1, and are not illustrated again. The differences between FIGS. 3 and 3-1 can be known with reference to the illustrations of FIGS. 2D and 2D-1.

Embodiment 3

Figure 4A:
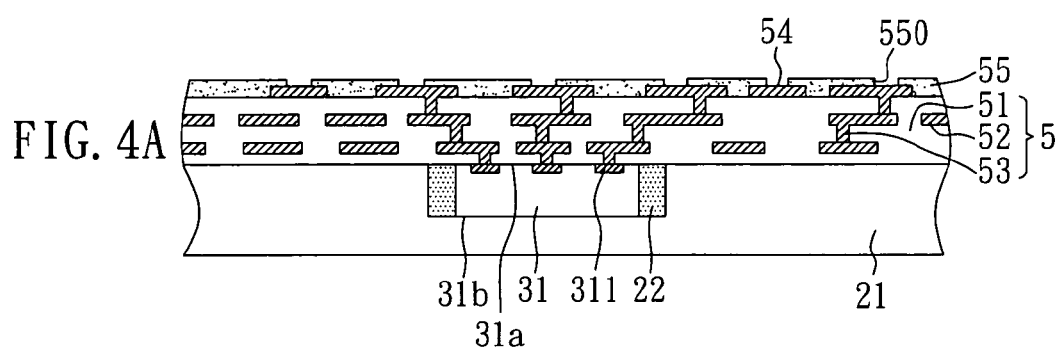
FIGS. 4A and 4B show a cross-section flowchart of the manufacturing in Embodiment 3 of the present invention.
Figure 4B:
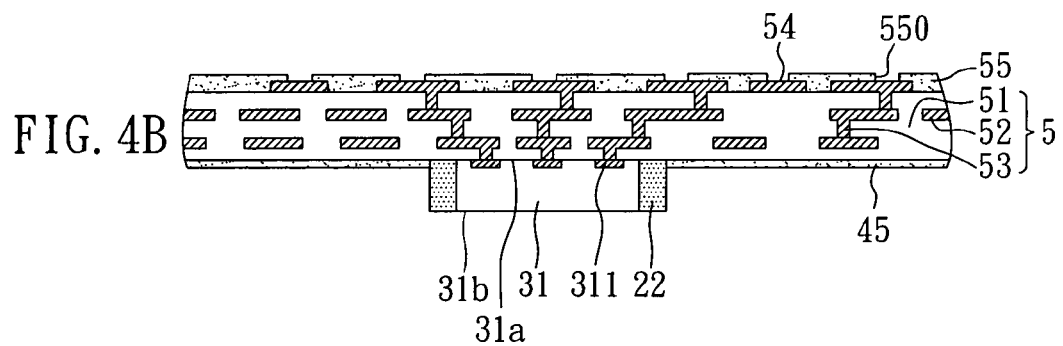

The present Embodiment has some differences as compared to Embodiment 1, explained by the following. With reference to FIG. 4A, the built-up structure 5 is first formed on the surface of the metal carrier board 21 and on the active surface 31a of the semiconductor chip 31. Then, the metal carrier board 21 is totally removed. As shown in FIG. 4B, the first solder mask 45 can be formed by stencil printing etc. on the uncovered region of the surface with the semiconductor chip 31 disposed thereon of the built-up structure 5 because the properties (like the relatively high hygroscopicity) of the dielectric material used as the dielectric layer 51 of the built-up structure 5 may be sensitive to the environment. As a result, the manufacturing of the present invention is accomplished.

The present invention further provides a package structure of a coreless substrate with direct electrical connections to a semiconductor chip, which comprises a semiconductor chip 31, a built-up structure 5, and a first solder mask 45 as shown in FIGS. 2E and 2E-1. The semiconductor chip 31 has an active surface 31a and an opposite inactive surface 31b. The active surface 31a has a plurality of electrode pads 311 thereon. The built-up structure 5 has a first surface 5a and an opposite second surface 5b. The built-up structure 5 comprises at least one dielectric layer 51, at least one circuit layer 52 stacked on the dielectric layer 51, and a plurality of conductive vias 53; the outermost circuit layer 52 of the second surface 5b of the built-up structure 5 has a plurality of conductive pads 54. The first solder mask 45, which has a plurality of openings 450 corresponding to the electrode pads 311 of the semiconductor chip 31, is formed on the first surface 5a of the built-up structure 5. Some of the conductive vias 53 in the built-up structure 5 each respectively penetrate the first openings 450 of the first solder mask 45, electrically connecting to the electrode pads 311 of the semiconductor chip 31.

The aforesaid structure can further comprise a second solder mask 55 formed on the second surface 5b of the built-up structure 5. The second solder mask 55 has a plurality of second openings 550 exposing the conductive pads 54 of the built-up structure 5.

The aforementioned structure can further comprise an adhesive material 22 wrapping and protecting the semiconductor chip 31, also enhancing the adhesion between the semiconductor chip 31 and the built-up structure 5. In addition, the inactive surface 31b of the semiconductor chip 31 is exposed to dissipate heat generated by the semiconductor chip 31 during operation.

The foregoing structure, as shown in FIG. 3, can further comprise a metal supporting frame 21' formed on the first solder mask 45 to thereby enhance the rigidity of the built-up structure 5.

Although the present invention has been explained in relation to its preferred embodiment, it is to be understood that many other possible modifications and variations can be made without departing from the scope of the invention as hereinafter claimed.

What is claimed is:

1. A package structure in which a coreless substrate has direct electrical connections to a semiconductor chip, comprising:
   a semiconductor chip having an active surface and an opposite inactive surface, wherein the active surface has a plurality of electrode pads thereon;
   a built-up structure having a first surface and an opposite second surface, wherein the built-up structure comprises at least one dielectric layer, at least one circuit layer stacked on the dielectric layer, and a plurality of conductive vias; the outermost circuit layer of the second surface of the built-up structure has a plurality of conductive pads;
   a first solder mask, which has a plurality of openings corresponding to the electrode pads of the semiconductor chip, disposed on the first surface of the built-up structure, wherein parts of the conductive vias in the built-up structure each respectively penetrate and completely fill the first openings of the first solder mask, and electrically connect to and directly contact the electrode pads of the semiconductor chip; and
   a second solder mask disposed on the second surface of the built-up structure, wherein the second solder mask has a plurality of second openings exposing the conductive pads of the built-up structure and an adhesive material wrapping and protecting the semiconductor chip, also enhancing the adhesion between the semiconductor chip and the built-up structure, therewith the inactive surface of the semiconductor chip is exposed to dissipate heat generated by the semiconductor chip during operation.

2. The structure as claimed in claim 1, further comprising a metal supporting frame disposed on the first solder mask to thereby enhance the rigidity of the built-up structure.

3. A package structure in which a coreless substrate has direct electrical connections to a semiconductor chip, comprising:
   a semiconductor chip having an active surface and an opposite inactive surface, wherein the active surface has a plurality of electrode pads thereon;
   a built-up structure having a first surface and an opposite second surface, wherein the built-up structure comprises at least one dielectric layer, at least one circuit layer stacked on the dielectric layer, and a plurality of conductive vias; the outermost circuit layer of the second surface of the built-up structure has a plurality of conductive pads; and
   a first solder mask, which has a plurality of openings corresponding to the electrode pads of the semiconductor chip, disposed on the first surface of the built-up structure, wherein parts of the conductive vias in the built-up structure each respectively penetrate and completely fill the first openings of the first solder mask, and electrically connect to and directly contact the electrode pads of the semiconductor chip and an adhesive material wrapping and protecting the semiconductor chip, also enhancing the adhesion between the semiconductor chip and the built-up structure, therewith the inactive surface of the semiconductor chip is exposed to dissipate heat generated by the semiconductor chip during operation.

4. A package structure in which a coreless substrate has direct electrical connections to a semiconductor chip, comprising:
   a semiconductor chip having an active surface and an opposite inactive surface, wherein the active surface has a plurality of electrode pads thereon;
   a built-up structure having a first surface and an opposite second surface, wherein the built-up structure comprises at least one dielectric layer, at least one circuit layer stacked on the dielectric layer, and a plurality of conductive vias; the outermost circuit layer of the second surface of the built-up structure has a plurality of conductive pads;
   a first solder mask, which has a plurality of openings corresponding to the electrode pads of the semiconductor chip, disposed on the first surface of the built-up structure, wherein parts of the conductive vias in the built-up structure each respectively penetrate the first openings of the first solder mask, and electrically connect to the electrode pads of the semiconductor chip; and
   a second solder mask disposed on the second surface of the built-up structure, wherein the second solder mask has a plurality of second openings exposing the conductive pads of the built-up structure and an adhesive material wrapping and protecting the semiconductor chip, also enhancing the adhesion between the semiconductor chip and the built-up structure, therewith the inactive surface of the semiconductor chip is exposed to dissipate heat generated by the semiconductor chip during operation.

* * * * *